United States Patent
Liu et al.

(10) Patent No.: US 11,134,518 B2
(45) Date of Patent: Sep. 28, 2021

(54) COOPERATIVE MULTI-BAND OPERATION SCHEMES IN WIRELESS LOCAL AREA NETWORKS

(71) Applicant: MEDIATEK SINGAPORE PTE. LTD., Solaris (SG)

(72) Inventors: Jianhan Liu, San Jose, CA (US); Yongho Seok, San Jose, CA (US); Chao-Chun Wang, San Jose, CA (US); James June-Ming Wang, San Jose, CA (US); James Chih-Shi Yee, San Jose, CA (US); Thomas Edward Pare, Jr., San Jose, CA (US); Yungping Hsu, Taiwan (CN)

(73) Assignee: MEDIATEK SINGAPORE PTE. LTD., Singapore (SG)

(*) Notice: Subject to any disclaimer, the term of this patent is extended or adjusted under 35 U.S.C. 154(b) by 19 days.

(21) Appl. No.: 16/400,826

(22) Filed: May 1, 2019

(65) Prior Publication Data
US 2019/0342916 A1  Nov. 7, 2019

Related U.S. Application Data

(60) Provisional application No. 62/666,801, filed on May 4, 2018, provisional application No. 62/680,107, filed on Jun. 4, 2018.

(51) Int. Cl.
*H04W 74/08* (2009.01)
*H04W 80/02* (2009.01)
(Continued)

(52) U.S. Cl.
CPC ..... *H04W 74/0808* (2013.01); *H03M 13/255* (2013.01); *H04B 17/336* (2015.01);
(Continued)

(58) Field of Classification Search
CPC .......... H04W 74/0808; H04W 74/0833; H04L 1/0063; H04L 1/0073; H04B 17/336; H04B 7/0613; H04B 7/0686
See application file for complete search history.

(56) References Cited

U.S. PATENT DOCUMENTS

| 8,982,849 | B1 | 3/2015 | Salhotra et al. |
| 2010/0118792 | A1 | 5/2010 | Chung et al. |

(Continued)

FOREIGN PATENT DOCUMENTS

| CN | 103503554 A | 1/2014 |
| CN | 104301086 A | 1/2015 |

(Continued)

OTHER PUBLICATIONS

Deng et al, "IEEE 802.11be—Wi-Fi 7: New Challenges and Opportunities" IEEE 2020 (Year: 2020).*

(Continued)

*Primary Examiner* — Omer S Mian

(57) ABSTRACT

A cooperative multi-band wireless station architecture that enables full duplex operations of wireless stations (STAs). Such an STA includes a WIFI transceiver and one or more additional transceivers. The two transceivers (and the associated channels) operate in mutually exclusive WIFI bands or different types of protocols and therefore can transmit and/or receive simultaneously without signal interference to each other. The multiple transceivers can perform independent clear channel assessment (CCA) and then simultaneously perform signal transmission or reception jointly or independently. In a cooperative multi-band operation, one channel may be used as an independent assistant channel and responsible for supplying assistant information relevant to a transmission opportunity (TXOP) for the other channel (primary channel) to take corresponding actions. Alternatively, coordinated by a cooperative management unit
(Continued)

(CMU) in the STA, the multiple channels in the STA may jointly and simultaneously perform data transmission or reception as peers.

28 Claims, 8 Drawing Sheets

(51) Int. Cl.
| | |
|---|---|
| *H03M 13/25* | (2006.01) |
| *H04B 17/336* | (2015.01) |
| *H04L 1/00* | (2006.01) |
| *H04L 1/18* | (2006.01) |

(52) U.S. Cl.
CPC .......... *H04L 1/0063* (2013.01); *H04L 1/1819* (2013.01); *H04W 80/02* (2013.01)

(56) References Cited

U.S. PATENT DOCUMENTS

| | | | | |
|---|---|---|---|---|
| 2010/0227570 | A1* | 9/2010 | Hendin | .................. H04B 1/406 |
| | | | | 455/78 |
| 2011/0235611 | A1* | 9/2011 | Chun | ...................... H04L 47/10 |
| | | | | 370/329 |
| 2016/0134415 | A1* | 5/2016 | Chen | ......................... H04L 5/16 |
| | | | | 370/277 |
| 2018/0198494 | A1* | 7/2018 | Chu | ....................... H04L 5/0023 |
| 2019/0098664 | A1* | 3/2019 | Chu | .................. H04W 74/0816 |
| 2020/0053733 | A1* | 2/2020 | Li | ...................... H04W 72/0453 |

FOREIGN PATENT DOCUMENTS

| | | |
|---|---|---|
| EP | 3307007 A1 | 4/2018 |
| TW | 201720212 A | 6/2017 |

OTHER PUBLICATIONS

Zhou et al, "IEEE 802.11ay-Based mmWave WLANs: Design Challenges and Solutions", IEEE 2018 (Year: 2018).*

\* cited by examiner

COOPERATIVE MULTI-BAND OPERATION SCHEMES IN WIRELESS LOCAL AREA NETWORKS

CROSSREFERENCE TO RELATED APPLICATION

This patent application claims priority and benefit of: the U.S. Provisional Patent Application No. 62/666,801, entitled "INDEPENDENT CHANNEL ASSISTED WIRELESS LOCAL NETWORKS," filed on May 4, 2018; the U.S. Provisional Patent Application No. 62/680,107, entitled "COOPERATIVE MULTI-BAND OPERATION SCHEMES IN WIRELESS LOCAL NETWORK," filed on Jun. 4, 2018. The entire contents of the foregoing patent applications are herein incorporated by reference for all purposes.

TECHNICAL FIELD

Embodiments of the present disclosure relate generally to the field of wireless network communication, and more specifically, to the field of multi-transceiver WIFI communication devices.

BACKGROUND OF THE INVENTION

Current wireless stations (STAs) compliant with predominant WIFI communication protocols are built for half-duplex operations: two stations (STAs) can communicate with each other, but cannot transmit simultaneously. That is, between two communicating STAs, data can only be transmitted in one direction at a time, usually in a manner of so-called "listen-before-talk."

In many WIFI transmission mechanisms, this constraint significantly limits the efficiency of a WLAN. For example, aggregated MAC Protocol Data Unit (A-MPDU) has become a popular mechanism for transmission of long packets, where a long packet is divided into multiple MPDU subframes to transmit, effectively reducing the error probability. Each MPDU contains its own frame check sequence (FCS) for error detection at the receive end. After receiving every certain number of MPDUs, the receive STA may send a block acknowledgement (BA) to the transmit STA to indicate whether transmission errors to one or more MPDUs. A-MPDU eliminated the need to acknowledge every packet; instead a data stream receives a BA at the end of the stream that is a packet containing the acknowledgement for all packets. This means that the transmission medium is used more efficiently because less time is spent idle. It reduces the retransmission time of multiple packets into one and removes the time waiting for acknowledgements.

However, this also means that the transmit STA cannot receive a transmission error feedback, and accordingly terminate the transmission or take measures to remedy, until a large block of payload data has been transmitted to the receive STA. This can constitute a substantial waste of transmission time and eventually can lower the throughput and efficiency of the associated network.

SUMMARY OF THE INVENTION

Embodiments of the present disclosure are directed to systems and methods of using multiple transceivers, and correspondingly multiple channels, in a WIFI station (STA), to enable full duplex communication between WIFI STAs, thereby enhancing transmission efficiency, data rate, throughput and flexiblity of the wireless local area networks (WLANs).

Embodiments of the present disclosure provide a wireless STA (access point (AP) STA or non-AP STA) equipped with at least one wireless transceiver in addition to a WIFI transceiver. The multiple transceivers can operate on mutually exclusive WIFI bands (e.g., 2.4 GHz and 5 GHz WIFI bands) or on different types of protocols (e.g., WIFI and Bluethooth®), and therefore there would be no signal interference between them during simultaneous operations. In the scenarios that one transceiver receives at the same time that the other one transmits, the STA in effect simultaneously receives from, and transmits to, other STAs in a full duplex fashion. In some embodiments, two transceivers are activated to operate simultaneously after a clear channel assessment is performed for each transceiver independently of each other and confirms that both channels are available.

In some embodiments, a first transceiver (WIFI transceiver) is used to perform data transmission while a second transceiver is used in an auxiliary manner to assist the transmission. For example, while the first transceiver is transmitting data, the second transceiver may receive control or other information from another STA with regard to the data transmission and forward it to the first transceiver. The second transceiver thereby serves in an "independent assisting channel (IAC)," which allows the STA to receive relevant information on the data transmission without stopping transmission. In response, the first receiver may advantageously take prompt actions based on the forwarded information. When the IAC is not activated, the STA may operate using only the first transceiver. Depending on the applications and use cases, the IAC of an STA can be used to receive or transmit various types of assistant information to facilitate communication tasks performed by the first transceiver.

For example during transmission of an A-MPDU, the receive STA can send feedback information to the transmit STA via the IAC, such as the acknowledgement (ACK) or negative acknowledgement (NACK) frames with regard to A-MPUD subframes, signal-to-noise ratio (SNR) or channel state information (CSI). If too many NACKs are received or if the SNR is too low to support correct transmission, the transmit STA may promptly abort the A-MPDU transmission or take other remedial action to reduce waste of transmission time.

In some embodiments, in a transmission adopting hybrid automatic repeat requests (hybrid ARQs), while the first transceiver operates to transmit MPDUs to another STA, the other transceiver receives feedback aided ACK frames and forwards to the first transceiver. Based on the ACK frames, the STA can perform fast link adaptation or insert retransmitted low-density parity-check (LDPC) code words in the data.

In some embodiments, an IAC in an AP can provide assistance in scheduling or rescheduling an UL MU transmission. The IAC can be used to collect information from a plurality of non-AP STAs while the AP is engaged in a transmitting or receiving task. The second transceiver then forwards the information to the first transceiver which accordingly schedules an UL MU transmission or adjusts an existing schedule. As the AP can obtain the relevant information from the IAC, rather than on its own, the AP can frequently and dynamically adjust scheduling in successive UL MU transmissions without requiring additional delay.

In some embodiments, the multiple transceivers (and the corresponding multiple channels) in an STA can be used to perform data transmission as peers. A cooperative management unit (CMU) in the STA may exchange or aggregate information between the transceivers such that data or other information may be transmitted or received by using the multiple channels. For example, one channel can offload a transmission or reception task, partially or entirely, to the other channel.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying figures, in which like reference characters designate like elements.

DETAILED DESCRIPTION

Figure 1:
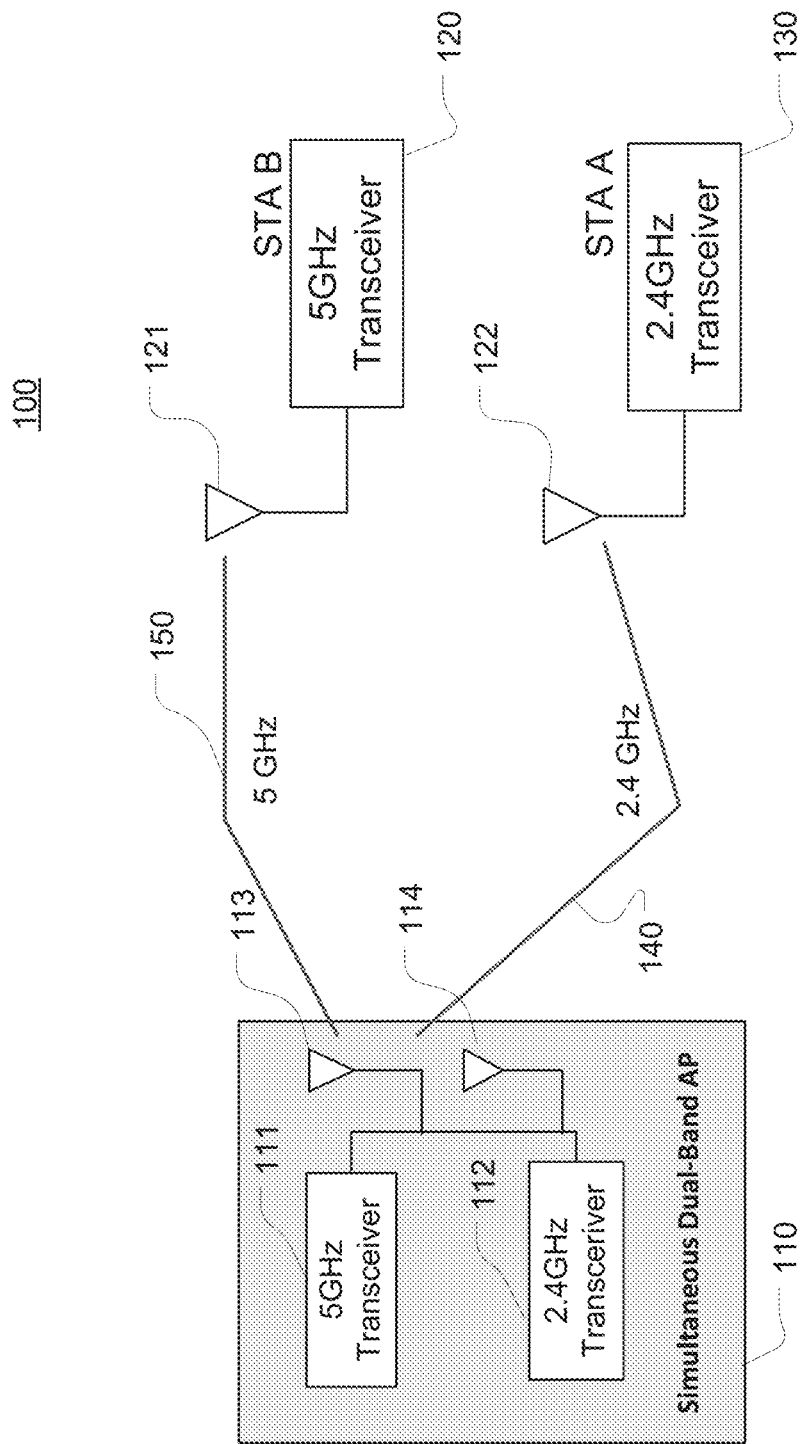
FIG. 1 illustrates an exemplary WLAN in which an exemplary station (STA) has two transceivers and is configured to communicate with the other STAs in full duplex through channels encompassed in two mutually exclusive WIFI bands in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the Figures. Similarly, although the views in the drawings for the ease of description generally show similar orientations, this depiction in the Figures is arbitrary for the most part. Generally, the invention can be operated in any orientation.

Cooperative Multi-Band Operation Schemes in Wireless Local Area Networks

Embodiments of the present disclosure are described in detail with reference to the formats and structures of Physical Layer Convergence Protocol (PLCP) protocol data unit (PPDUs), data frames, control frames and management frames as defined in the high efficiency (HE) wireless local area (WLAN)-based IEEE 802.11 family of Specifications and Standards. However, the present disclosure is not limited to any specific transmission formats or structures, nor limited to any specific industry standards or specifications.

The IEEE 802.11 standards provide several distinct radio frequency (RF) ranges for use in Wi-FI communications. These WIFI bands include 900 MHz 2.4 GHz, 3.6 GHz, 4.9 GHz, 5 GHz, 5.9 GHz and 60 GHz bands. Each band is divided into a multitude of channels. Prevalent WIFI devices operate on 26 MHz centered around 915 MHz, about 100 MHz centered around 2.450 GHz and four sub-bands in the 5 GHz band. Currently, Wireless-B and Wireless-G devices operate on 2.4 GHz; and high throughput (HT), very high throughput (VHT), and HE devices can operate on 2.4 GHz and 5 GHz.

Embodiments of the present disclosure provide a cooperative multi-band architecture that enables full duplex operations of wireless stations (STAs). Such an STA includes a WIFI transceiver and one or more additional transceivers. The two transceivers (and the associated channels) operate in mutually exclusive WIFI bands or different types of protocols and therefore can transmit and/or receive simultaneously without signal interference to each other. The multiple transceivers in an STA can perform independent clear channel assessment (CCA) and then simultaneously perform signal transmission or reception jointly or independently. In a cooperative multi-band operation, one channel may be used as an independent assistant channel and is responsible for receiving, collecting, or otherwise supplying, assistant information relevant to a transmission opportunity (TXOP) for the other channel (primary channel) to take various actions with regard to the TXOP. Alternatively, coordinated by a cooperative management unit (CMU) in the STA, the multiple channels in the STA may jointly and simultaneously perform data transmission or reception as peers.

Herein the terms "dual-band," "multi-band," "simultaneous dual-band" or "simultaneous multi-band" operations or devices may refer to usage of mutually exclusive WIFI bands, such as selected from 2.4 GHz, 5 GHz, and 6 GHz, which naturally does not cause wireless interference issues. The terms may also refer to usage of a WIFI band in combination with another type of wireless protocol, such as Wi-Fi direct, Zigbee, Z wave, Bluetooth, RF, 6LowPAN, or GPRS/3G/LTE.

In some embodiments, a cooperative multi-band operation described herein can be within 5 GHz or 6 GHz band alone. For example, any multiple 20 MHz channels can be aggregated for wideband transmission. In this mode, full duplex may not be allowed. The transmissions on different channels are synchronized.

FIG. 1 illustrates an exemplary WLAN 100 in which an exemplary station (STA) 100 has two transceivers 111 and 112 and is configured to communicate with the other STAs 120 and 130 in full duplex through channels encompassed in two mutually exclusive WIFI bands in accordance with an embodiment of the present disclosure. In this simplified example, the WLAN 100 forms a basis service set (BSS) and includes a dual-band AP 110 and non-AP STAs 120 and 130. According to embodiments of the present disclosure, the dual-band AP 110 is equipped with a 5 GHz and a 2.4 GHz WIFI transceivers 111 and 112, each coupled with an antenna 113 or 114. Through the channels 150 and 140 which are respectively encompassed in the two WIFI bands, the two transceivers can be advantageously actively engaged in signal transmission or reception at the same time without signal interference. In this example, STA A 130 and STA B 120 each have a single transceiver, respectively operating in 2.4 GHz and 5 GHz channels 150 and 140. Thus each STA 120 or 130 only communicates with a corresponding transceiver in the AP 110. At the AP, one transceiver can transmit signals in a transmission opportunity (TXOP) while the other one is receiving signals with regard to the same TXOP through non-interfering channels, which in effect advantageously enables the AP to operate in full duplex manner.

In some embodiments, a cooperative management unit (CMU) within the STA is configured to coordinate multi-band operations between the multiple transceivers in the STA. The CMU may function to facilitate information or data exchange between the transceivers, or aggregate or fragment data so that they can be transmitted or received via different bands. In some embodiments, a cooperative multi-band operation involves independent data transmission or reception by using the multiple bands, where data fragmentation or data aggregation may be performed by the CMU. In some embodiments, the CMU can coordinate a multi-band operation in which an STA transmits data packets by using joint coding across all the bands. In some other embodiments, an STA can transmit data packet by using independent coding on each band. In this case, multiple encoders and decoders are needed in the STA. In some embodiments, one channel is used as an auxiliary (referred to as "independent assistance channel (IAC)" herein) and provides assistance information to the primary channel, such as reporting channel conditions and buffer status.

Figure 2:
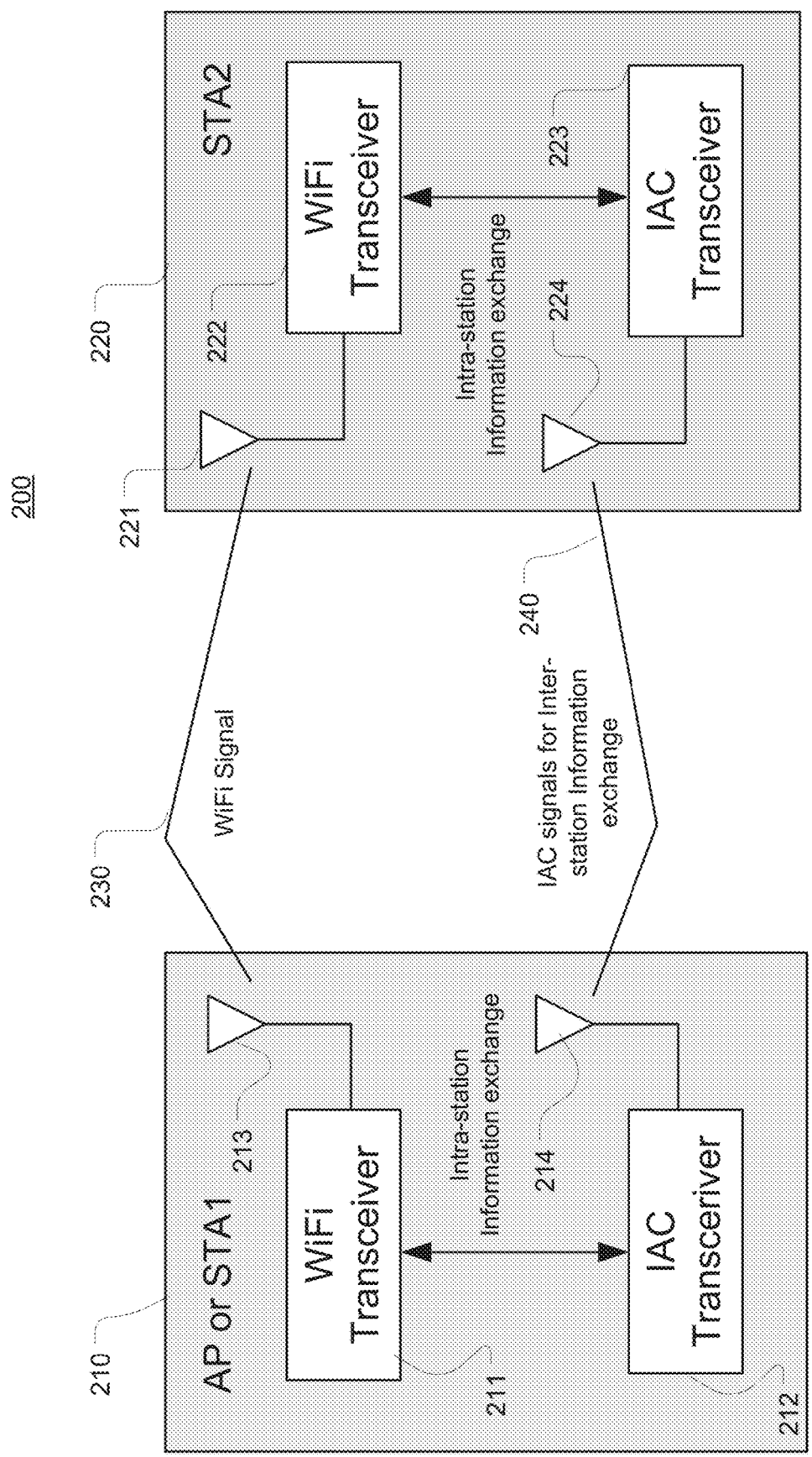
FIG. 2 illustrates an exemplary WLAN in which an exemplary dual-band STA has two transceivers and is configured to communicate with another dual-band STA in full duplex in accordance with an embodiment of the present disclosure.

FIG. 2 illustrates an exemplary WLAN 200 in which an exemplary dual-band STA 210 has two transceivers 211 and 212 and is configured to communicate with another dual-band STA 220 in full duplex in accordance with an embodiment of the present disclosure. Each STA 210 or 220 can transmit and receive at the same time, and can be either an AP STA or a non-AP STA. Each transceiver 211, 212, 222 or 223 in an STA 210 or 220 is operable to communicate with a corresponding transceiver in the other STA which uses the same WIFI band and/or the same protocol. Each transceiver is associated with an antenna 213, 214, 221 or 224.

In this example, the WIFI transceivers 213 and 222 are used for the primary channel 230 for data communication while the transceivers 212 and 223 are IAC transceivers used for the IAC 240. In some embodiments, the IAC transceivers 212 and 223 may be WIFI transceivers operating on different WIFI bands than the primary transceivers 211 and 222. In some other embodiments, the IAC transceivers 212 and 223 may operate on a different transmission mechanism, such as ultra-wide band transmission, or a frequency hopping scheme. Particularly, the transceivers 212 and 223 can be a different type of transceiver, such as a Wi-Fi direct, Zigbee, Z wave, Bluetooth, RF, 6LowPAN, or GPRS/3G/LTE transceiver.

When the two channels in separate bands are all CCA clean, one channel is used as the IAC to assist the transmissions on the other channel. The two transceivers in each STA perform independent CCA on the mutually exclusive channels prior to a multi-band operation. For example, CCA on a channel in 2.4 GHz band and CCA on a channel in 5 GHz band.

During operation, WIFI signals and the IAC signal can be transmitted simultaneously in the WLAN 200 because the transmissions are performed on separate channels and separate transceivers. Particularly, the IAC may be used to exchange control or other assistance information between the STAs 210 and 220 and supply the information to the primary transceivers via intra-station information exchange. The assistance information can be utilized by the primary transceivers to take actions for various purposes, as described in greater detail below. In some embodiments, the assistant information provided by the IAC transceivers is not essential to the WLAN operations. If such information is not supplied correctly, the WLAN can fall back to use only the primary channel and operate in the conventional way.

By using dual-band operations, an individual STA can receive and transmit at the same time, and therefore there is no need for "listen-before talk" or "time-controlled listen-before-talk." This can significantly and advantageously enhance the efficiency of the WLAN.

Figure 3:
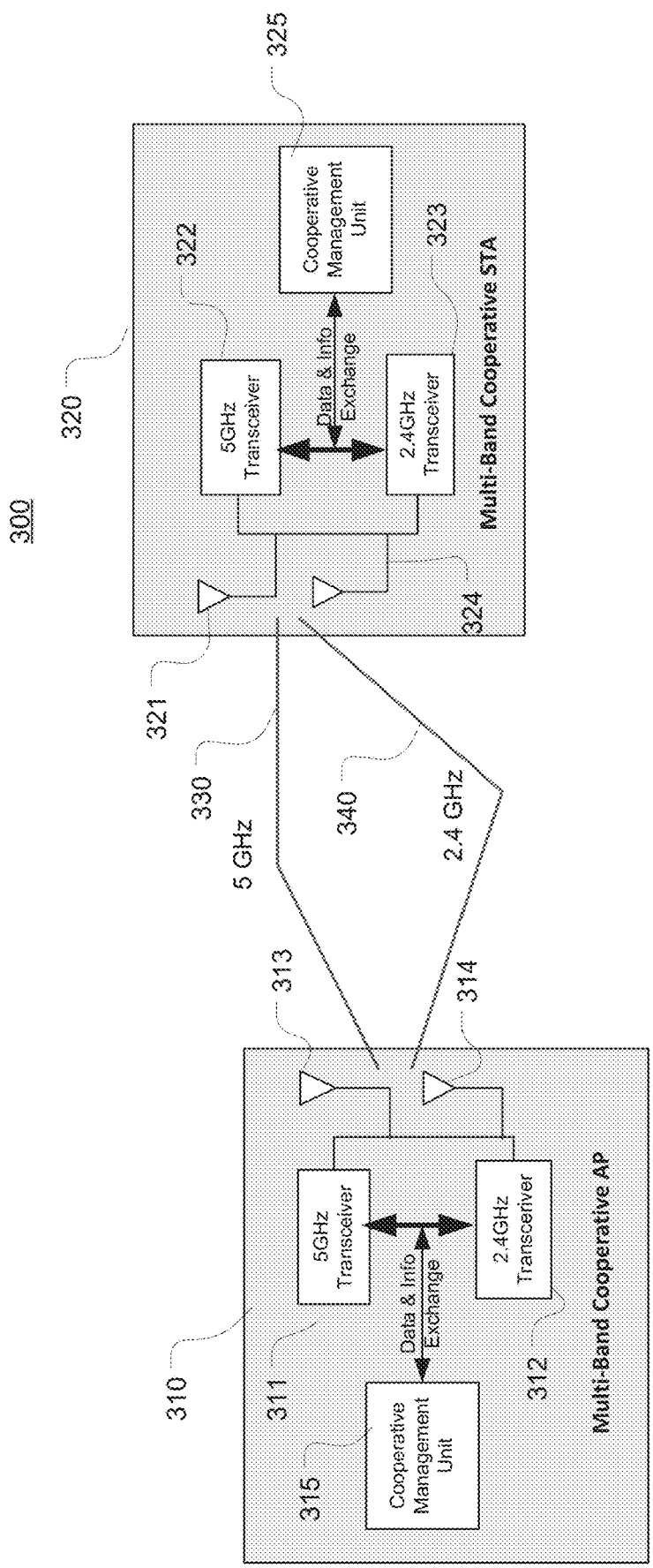
FIG. 3 illustrates an exemplary WLAN in which an exemplary multi-band STA is configured to use a CMU to facilitate communication with another multi-band STA in full duplex in accordance with an embodiment of the present disclosure.

FIG. 3 illustrates an exemplary WLAN 300 in which an exemplary multi-band STA 310 is configured to use a CMU to facilitate communication with another multi-band STA 320 in full duplex in accordance with an embodiment of the present disclosure. STA 310 is an AP and STA 320 is a non-AP STA, and they can communicate with each other in full duplex. Similarly in this example, the WIFI transceivers 313 and 322 are used for the primary channel 330 operating on 5 GHz for data communication while the transceivers 312 and 323 are used for the IAC 340 operating on 2.4 GHz. Each STA 310 or 320 includes a CMU 315 or 325 coupled between the primary and the IAC transceivers and can be used for intra-STA information and data exchange.

As noted above, the conventional A-MPDU transmissions or aggregate MAC Service Data Unit (A-MSDU) transmissions face the problem of delayed fed back to reception error information to the transmit STAs. According to embodiments of the present disclosure, in a cooperative multi-band operation, during an A-MPDU transmission by using a primary WIFI transceiver in the transmit STA, the IAC transceiver of the same STA can be used to receive assistant information, such as the reception status and channel state information, and forward it immediately to the primary transceiver.

Figure 4A:
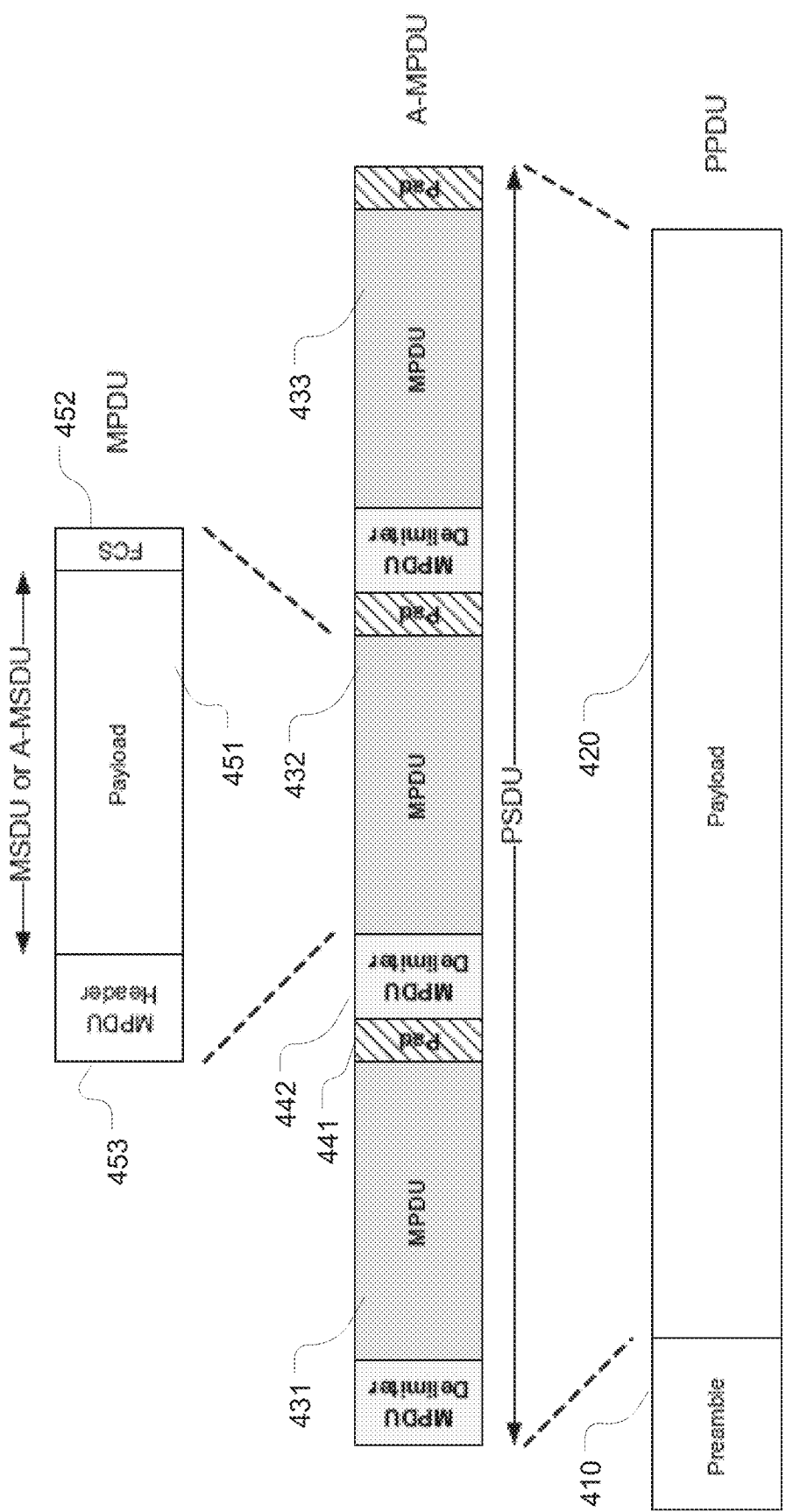
FIG. 4A illustrates the structure of an A-MPDU comprising multiple MPDUs.

FIG. 4A illustrate the structure of an A-MPDU 400 comprising multiple MPDUs. The A-MPDU 400 has a preamble 410 and a payload 420, and the payload 420 is composed of a sequence of A-MSDU subframes. A subframe (e.g., 431-433) has a subframe header (e.g., 453) followed by an MPDU 451, frame check sequence (FCS) 452 and padding 454. A MDPU delimiter is disposed between subframes. Frame aggregation allows multiple smaller MPDUs to be grouped together into a single frame, reducing the amount of overhead that would have been necessary for each individual frame.

Figure 4B:
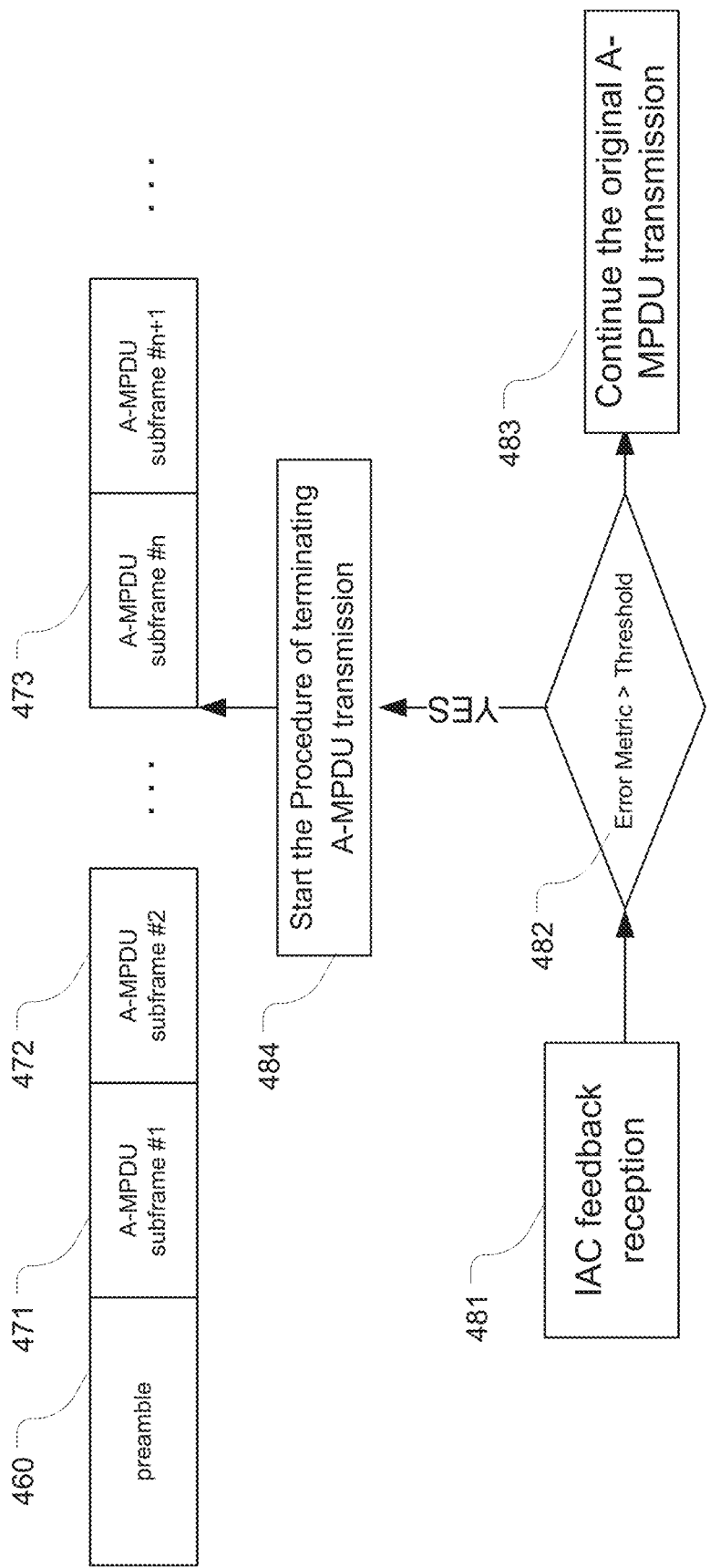
FIG. 4B illustrates an exemplary computer controlled process of an A-MDPU transmission in a cooperative multi-band operation in accordance with an embodiment of the present disclosure.

FIG. 4B illustrates an exemplary computer controlled process of A-MDPU transmission in a cooperative multi-band operation in accordance with an embodiment of the present disclosure. In this example, an A-MPDU is transmitted from STA1 to STA2 through a primary channel. The A-MPDU includes a preamble 460 and a sequence of subframes 471-473, for example.

The STA2 decodes the received A-MPDU subframes and check the FCS of each A-MPDU subframe. STA2 also monitors the channel state information (CSI) and the receiver SNR of the receiving A-MPDU. Conventionally, only after receiving every certain number of MPDUs (or "a MPDU block" herein), the receive STA sends a block acknowledgement (BA) to the transmit STA to indicate whether any transmission errors occurs to one or more MPDUs.

According to embodiments of the present disclosure, while the primary transceiver in STA1 is still in the process of transmitting an MPDU block, STA2 can use the IAC channel (at 481) to send feedback information about reception of this MPDU block to STA1, such as the ACK/NACK of A-MPDU subframes and/or SNR and/or CS. However, it will be appreciated that the present disclosure is not limited to any particular information that can be transmitted via an IAC. At STA1, the feedback information received by the IAC transceiver is forwarded from the primary transceivers through intra-STA communication, e.g., by using the CMU. In this way, such feedback assistance information can be delivered to the primary transceiver without requiring the transmission to be stopped, and the STA1 can receive the feedback information before completely transmitting the entire MPDU block. This advantageously allows the primary transceiver at STA1 to promptly perform abort transmission, fast rate adaptation, or and any other suitable actions that are well known in the art.

More specifically, if STA1 determines (at 482) that too many NACKs have been received or the reported SNR is too low to support the current transmission, STA1 can promptly start the procedure to abort or terminate the A-MPDU transmission (at 484), possibly before the entire MPDU block is transmitted. It will be appreciated that the STA1 may take any other suitable action in response to the feedback information without departing from the scope of the present disclosure. For example, the termination indication can be sent by either inserting the indication into one residual A-MPDU subframe or via the IAC. If the feedback information indicates otherwise, the STA1 continues the original A-MPDU transmission at 483.

In some embodiments, based on the IAC information, STA1 can perform link adaptation, for example, change the rate of the residual A-MPDU subframes and send the new rate information to STA2 via IAC.

In some embodiments, the IAC information is non-essential to the data transmission. In case the IAC feedback information is not received successfully at the transmitter of the A-MPDU, it switches back to the conventional scheme that utilizes the block acknowledgements (BAs).

In some embodiments, cooperative multi-band operations can be applied for facilitating uplink (UL) multi-user (MU) transmissions. The efficiency of a UL MU transmission relies on the AP's knowledge of status of non-AP STAs and the associated channels, such as buffer status, data access category, channel conditions, data availability for UL transmission, and etc. Only by knowing such information can the AP schedule intelligently with good choice of power, rate and RU allocations.

To initiate a UL MU transmission, the AP schedules UL transmissions from multiple STAs based on relevant information collected from the STAs. Conventionally, to this end, an AP having a single WIFI transceiver needs to dedicate certain transmit time and receive time to collect such information. This information is currently provides by 1-bit NDP for buffer status which has a lot of constraints.

According to embodiments of the present disclosure, with the assistance of IACs, AP can obtain information concurrently with data transmission. The AP can schedule intelligently based on the information and also can dynamically adjust scheduling in successive UL MU transmissions.

Figure 5:
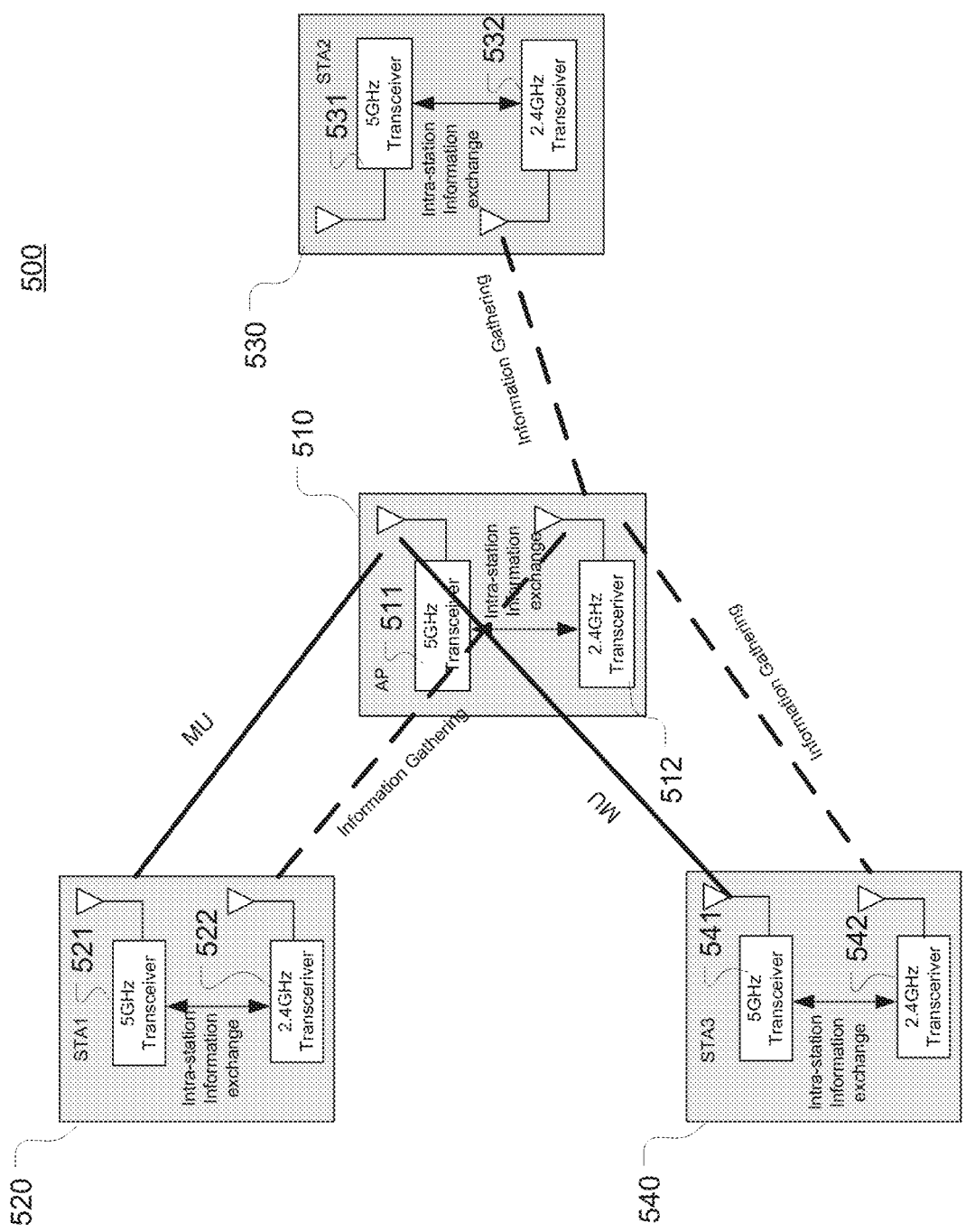
FIG. 5 illustrates an exemplary WLAN in which a dual-band AP uses the IACs to collection information from the non-AP STAs to schedule or reschedule an UL MU transmission in accordance with an embodiment of the present disclosure.

Particularly, an AP capable of multi-band full duplex operations can use one band (e.g., the IAC) to communicate with multiple STAs to collect the information and the other band for data transmission or any other tasks. FIG. 5 illustrates an exemplary WLAN in which a dual-band AP 510 uses the IACs to collect information from the non-AP STAs 520, 530 and 540 to schedule or reschedule a UL MU transmission in accordance with an embodiment of the present disclosure. In this embodiment, each STA has a 5 GHz (521, 531 or 541) and a 2.4 GHz (522, 532 or 542) transceivers. The 5 GHz transceivers are used for the primary channels and the 2.4 GHz transceivers are used for the IACs (shown in dashed lines).

For example, for the initial scheduling, the 2.4 GHz transceiver 512 in the AP gathers information from the STAs 520, 530 and 540 with regard to a UL MU TXOP. The Based on the information, the AP can schedule the UL MU TXOP, and the primary transceiver 511 accordingly initiates the transmission through the primary channels (solid lines), e.g., by using a trigger frame. In the illustrated example, the gathered information indicates that the STA 530 has no data to transmit, and therefore, the UL MU transmission only involves STAs 520 and 540.

By the same token, during the UL MU transmission, the AP continues to use the IAC to gather information of buffer status, data access category, and channel state information from the non-AP STAs. Based on the information, the AP may adjust the MU transmissions taking place on the primary channel, such as rescheduling the first STAs of higher priority data access category in the UL MU transmission, or adding another STA. In some embodiments, the AP can adjust the grouping MU transmission based on channel conditions collected from the IAC.

Hybrid Automatic Repeat Request (HARQ) is an error control technique that improves link performance in a resource-constrained wireless communication environment. HARQ is a combination of high-rate forward error-correcting coding and ARQ error-control. In standard ARQ, redundant bits are added to data to be transmitted using an error-detecting (ED) code such as a cyclic redundancy check (CRC). Receivers detecting a corrupted message will request a new message from the sender. In Hybrid ARQ, the original data can be encoded with a FEC code. The FEC code is selected to correct an expected subset of all errors that may occur, while the ARQ method is used as a fall-back to correct errors that are uncorrectable using only the redundancy sent in the initial transmission.

Figure 6:
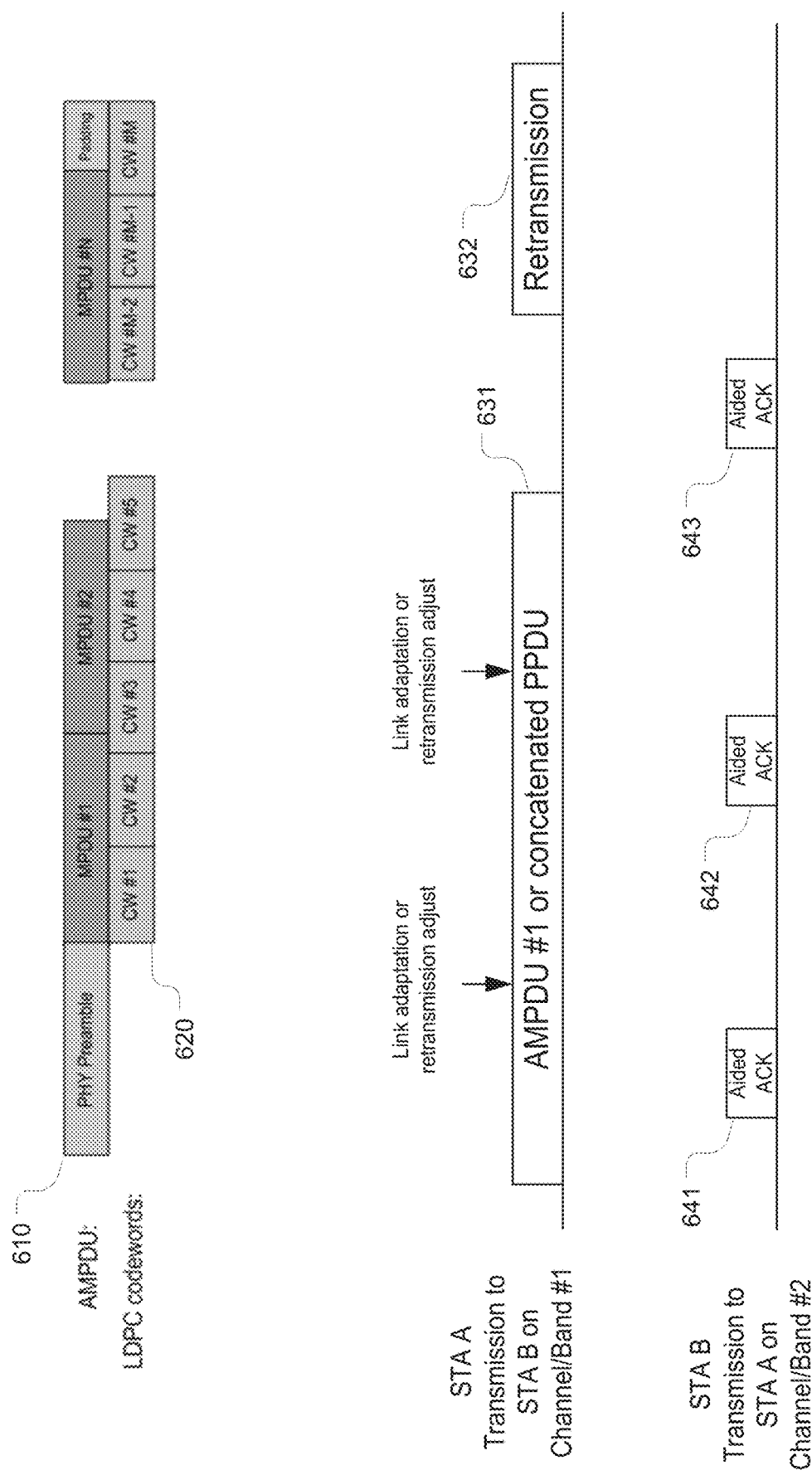
FIG. 6 illustrates an exemplary process in which cooperative dual-band full duplex STAs perform an H-AQR operation in accordance with an embodiment of the present disclosure.

In some embodiments, in a cooperative multi-band full duplex operation, an IAC can be used to facilitate hybrid automatic repeat request (H-ARQ) communications. FIG. 6 illustrates an exemplary process in which cooperative dual-band full duplex STAs perform an H-AQR operation in accordance with an embodiment of the present disclosure. As shown, the A-MPDU 610 includes a PHY preamble and a payload comprising a number (N) of MPDUs. The payload also has a number (M) of LPDC codewords 620. For each transmitted A-MPDU or PPDU, each LDPC code word contains a CRC.

Particularly, the primary band (Channel/Band #1) is used for A-MDPU transmission from STA A to STA B; and the IAC (Channel/Band #2) is used to feedback Aided ACK from STA B to STA A at the same time to assist the transmission on Channel/Band #1. As shown, while STA A transmits A-MPDU #1 631 (or a concatenated PPDU) on Channel/Band #1, it also receives Aided ACKs 641 and 642. In response to the Aided ACKs 641 and 642, the STA A performs link adaptation or retransmission adjustment. In response to the Aided ACK 643, the STA A performs retransmission.

In still some other embodiments, the multiple transceivers in a multi-band STA can transmit/receive the same type of information as peers, e.g., data or essential information relative to data transmission. In some embodiments, a transceiver can offload an on-going transmission to the other transceiver. For example, during a data transmission on the first band/channel, the transmit STA performs CCA on the other bands/channels. If it is detected that the other bands/channels are CCA clean, the STA can offload the rest of the data transmission (in part or in whole) to the other bands/channels. The STA may switch to use the other bands/channels and terminates the transmission on the first band/channel, e.g., by clearing the first band/channel. Alternatively, the STA continues to use the first band/channel for the data transmission concurrently with the other bands/channels.

Figure 7:
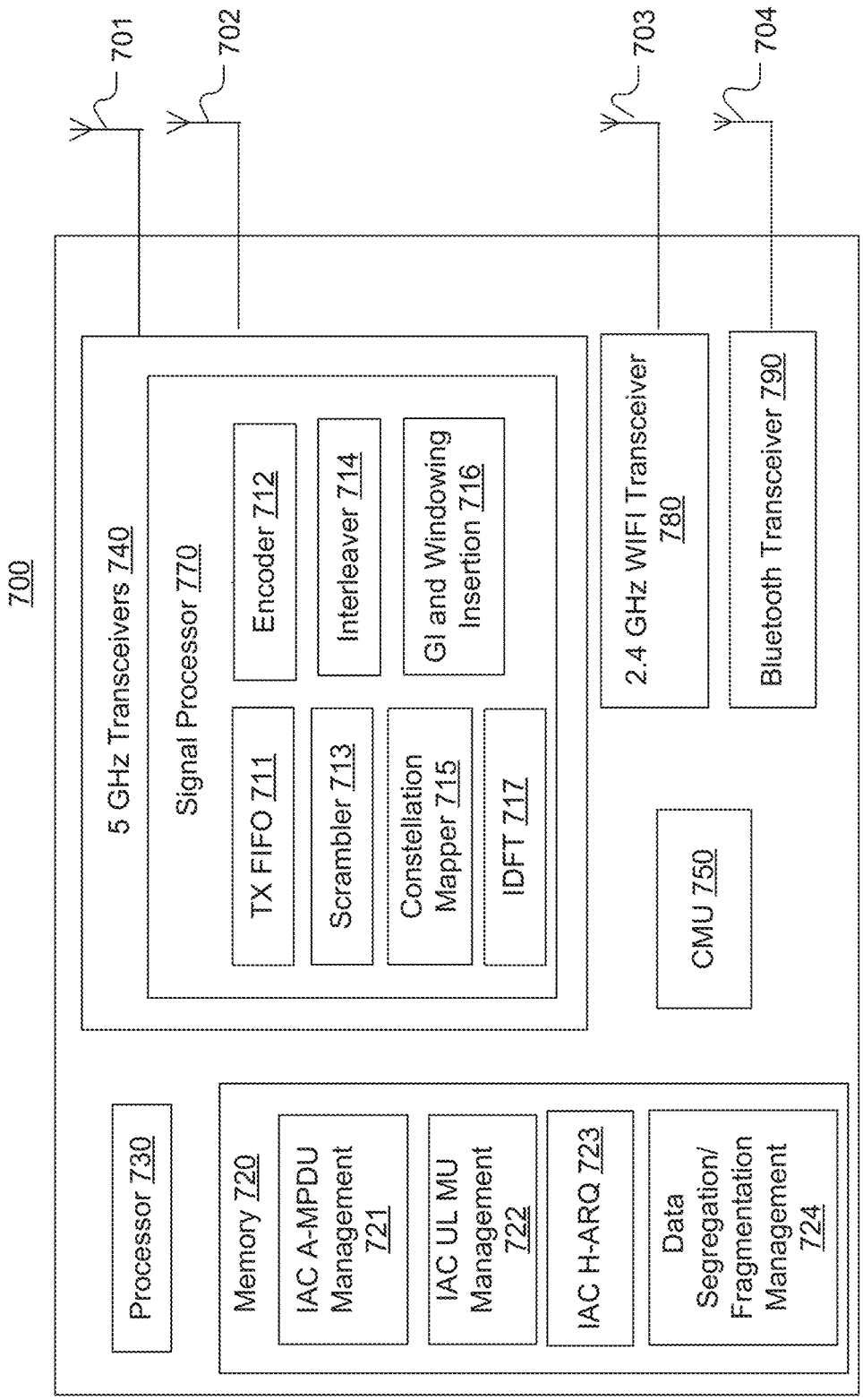
FIG. 7 is a block diagram illustrating an exemplary wireless communication device capable of cooperative multi-band operations in full duplex in accordance with an embodiment of the present disclosure.

FIG. 7 is a block diagram illustrating an exemplary wireless communication device 700 capable of cooperative multi-band operations in full duplex in accordance with an embodiment of the present disclosure. The communication device 700 may be an AP, a repeater, or a non-AP device, having a transceiver configured for data communication, e.g., a general purpose computer, a smart phone, a tablet wearable device, a sensor used on Internet of Things (IoT), and etc.

The device 700 includes a main processor 730, a memory 720, a 5 GHz WIFI transceiver 740 coupled to an array of antenna 701-702, a 2.4 GHz WIFI transceiver 780 coupled to the antenna 703, a Bluetooth transceiver 790, and a CMU 750. The CMU 750 is configured to control and coordinate the cooperative multi-band operations among the transceivers 740, 780, 790, for example by performing data fragmentation or data segregation, intra-STA information exchange, switching from using one transceiver to another, etc.

The CMU 750 can control the transceivers 740, 780 and 790 to operate in a primary-auxiliary manner or as peer transceivers with respect to a TXOP. The CMU 750 may be implemented by using circuit hardware, software, firmware or a combination thereof, and may be controlled by the instructions stored in the several management modules 721-724.

The memory 720 includes an IAC A-MPDU management module 721 having instructions and information related to using the transceivers 780 (and/or 790) to receive assistant information to the device in an A-MPDU TXOP. Based on the information, the transceiver 740 may take corresponding actions with regard to TXOP, as described in greater detail with reference to FIG. 4A and FIG. 4B.

An IAC UL MU management module 722 has instructions and information related to using the transceivers 780 (and/or 790) to gather information from a plurality of non-AP STAs. Based on the information, the transceiver 740 can schedule or reschedule a UL MU TXOP, as described in greater detail with reference to FIG. 5.

An IAC H-ARQ management module 723 has instructions and information related to using the transceivers 780 (and/or 790) to receive Aided ACKs an H-ARQ TXOP, based on which the transceiver 740 can take corresponding actions with respect to the TXOP, as described in greater detail with reference to FIG. 6.

A data segregation/fragmentation management module 724 as instructions and information related to performing data segregation and fragmentation such that data transmission in an TXOP can be offloaded from one transceiver to another, as described in greater detail above. However, the memory may have various other modules related to cooperative multi-band operations, as well as other function modules that are well known in the art.

The transceiver 740 includes various modules of the transmit path which are configured to generate data packets, control frames, or any other type of communication transmission units for transmission to another STA. For instance, it has a transmit First-In-First-Out (TX FIFO) 744, an encoder 746, a scrambler 713, an interleaver 714 a constellation mapper 715, an inversed discrete Fourier transformer (IDFT) 717, and a GI and windowing insertion module 716. The transceiver 740 also includes various modules of a receive path configured to receive data packets, control frames, or any other type of communication transmission units from another STA. The WIFI transceiver 780 may have a similar configuration as the transceiver 740. The Bluetooth transceiver may be implemented in any suitable manner that is well known in the art. As noted above, one or more of any other types of wireless transceivers that are well known in the art can be integrated in the device 700 and perform cooperative multi-band operations to enable the device to communicate with the other device in a full duplex manner.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A wireless communication device comprising:
a memory;
a first transceiver coupled to said memory and configured to perform wireless communication on a first wireless channel;
a second transceiver coupled to said memory and configured to perform wireless communication on a second wireless channel; and a cooperative management unit (CMU) coupled to said first transceiver and said second transceiver and configured to forward information between said first transceiver and said second transceiver, wherein said first transceiver, said second transceiver and said CMU are configured to:

perform clear channel assessment (CCA) independently of each other;

responsive to a determination that said first wireless channel and said second wireless channel are both available for a first transmission opportunity (TXOP), transmit data and control information to a first wireless communication device in a full duplex manner with regard to said first TXOP, wherein said first wireless channel is a WIFI channel; and responsive to a determination, through a CCA, that said second wireless channel is available while said first transceiver is transmitting a payload to the first wireless communication device, said first transceiver and said second transceiver transmitting said payload to said first wireless communication device in the first TXOP.

2. The wireless communication device of claim 1, wherein said second wireless channel is a WIFI channel, and wherein further said first and said second wireless channels are encompassed in WIFI bands that are mutually exclusive of each other.

3. The wireless communication device of claim 1, wherein said second transceiver is configured to operate in one of an ultra-wide band transmission mechanism and a frequency hopping mechanism.

4. The wireless communication device of claim 1, wherein, during said first TXOP: said first transceiver is configured to transmit first information to a third transceiver in said first wireless communication device; and said second transceiver is configured to receive second information from a fourth transceiver in said first wireless communication device.

5. The wireless communication device of claim 4, wherein said first information comprises a payload of an aggregated MAC-level protocol data unit (A-MPDU) that comprises multiple MPDU blocks, wherein each MPDU block comprises multiple MPDUs, wherein said second information comprises feedback information with regard to reception of an MPDU block of said payload.

6. The wireless communication device of claim 5, wherein said second transceiver is further configured to send said second information to said first transceiver, and wherein further said first transceiver is further configured to, upon receiving said second information and prior to completion of transmitting said MPDU block in entirety, abort transmission of said payload.

7. The wireless communication device of claim 5, wherein said second transceiver is further configured to send said second information to said first transceiver, and wherein further said first transceiver is further configured to, upon receiving said second information and prior to completion of transmitting said MPDU block in entirety, perform link adaption with regard to said transmitting said payload.

8. The wireless communication device of claim 5, wherein said second transceiver is further configured to send said second information to said first transceiver, and wherein further said first transceiver is further configured to, upon receiving said second information and prior to completion of transmitting said MPDU block in entirety, retransmit said payload or insert retransmitted low-density parity-check (LDPC) code words for a hybrid automatic repeat request (hybrid ARQ) process.

9. The wireless communication device of claim 5, wherein said feedback information comprises one of: an error metric with regard to reception of an MPDU; reception status with regard to said payload; channel state information; and a signal-to-noise ratio (SNR).

10. The wireless communication device of claim 1, wherein said second receiver is configured to:

collect third information from a plurality of non-access point stations (non-AP STAs) with regard to an uplink (UL) multi-user (MU) TXOP; and send said third information to said first transceiver; and wherein said first transceiver is further configured to, based on said third information:

schedule said UL MU TXOP based on said third information; and signal said plurality of non-AP STAs to transmit data to said first transceiver in said UL MU TXOP.

11. The wireless communication device of claim 1, wherein said first transceiver is configured to schedule a UL MU TXOP of transmission from a plurality STAs to said wireless communication device, wherein said second transceiver is configured to: collect fourth information from a plurality of non-AP STAs; and send said fourth information to said first transceiver, wherein further said first transceiver is further configured to adjust scheduling of a remainder of said UL MU TXOP based on said fourth information.

12. The wireless communication device of claim 11, wherein said fourth information comprises buffer status, data access category information and channel state information.

13. The wireless communication device of claim 1, wherein said first transceiver and said second transceiver are configured to jointly and simultaneously transmit the payload, wherein the payload is of an A-MPDU in said first TXOP.

14. The wireless communication device of claim 13, wherein said CMU is further configured to perform data fragmentation and data aggregation with regard to said first TXOP.

15. The wireless communication device of claim 13, wherein said second transceiver is configured to perform CCA during transmission of said payload from said first transceiver, wherein, in response to a determination that said second wireless channel is available: said first transceiver is configured to abort transmission of said payload via said first wireless channel; and said second transceiver is configured to start transmitting a remainder of said payload.

16. The wireless communication device of claim 13, wherein said second transceiver is configured to perform the CCA during transmission of said payload from said first transceiver.

17. A method of wireless communication performed by a wireless communication device comprising a first transceiver and a second transceiver, the method comprising:

said first transceiver and said second transceiver performing clear channel assessment (CCA) independently of each other, wherein said first transceiver is associated with a first wireless channel and said second transceiver is associated with a second wireless channel; and responsive to a determination that said first wireless channel and said second wireless channel are both available for a first transmission opportunity (TXOP), said first transceiver and said second transceiver cooperating to transmit data and control information to a first wireless communication device in a full duplex manner with regard to said first TXOP; and responsive to a determination, through a CCA, that said second wireless channel is available while said first transceiver is transmitting a payload to said first wireless communication device, said first transceiver and said second transceiver transmitting said payload to said first wireless communication device in the first TXOP, wherein said first transceiver communicates with said first wireless communication device on the first wireless channel, and said second transceiver communicates with said first wireless communication device on the second wireless channel, and wherein said first wireless channel is a WIFI channel.

18. The method of claim 17, wherein said second wireless channel is a WIFI channel, wherein said first and said second wireless channels are encompassed in WIFI bands that are mutually exclusive of each other.

19. The method of claim 17, wherein further said second transceiver is configured to operate in one of an ultra-wide band transmission mechanism and a frequency hopping mechanism.

20. The method of claim 17, wherein said cooperating comprises during said first TXOP: said first transceiver transmitting first information to a third transceiver in said first wireless communication device; and said second transceiver receiving second information from a fourth transceiver in said first wireless communication device.

21. The method of claim 20, wherein said first information comprises a payload of an aggregated MAC-level protocol data unit (A-MPDU) that comprises multiple MPDU blocks, and wherein said second information comprises feedback information with regard to reception of an MPDU block.

22. The method of claim 20 further comprising:
said second transceiver sending said second information to said first transceiver; and
upon receiving said second information and prior to completion of transmitting said MPDU block in entirety, said first transceiver aborting transmission of said payload.

23. The method of claim 21 further comprising:
said second transceiver sending said second information to said first transceiver; and
upon receiving said second information and prior to completion of transmitting said MPDU block in entirety, said first transceiver performing one of:
link adaptation;
retransmitting said payload; and
inserting retransmitted low-density parity-check (LDPC) code words for a
hybrid automatic repeat request (hybrid ARQ) process.

24. The method of claim 20 further comprising:
said second receiver collecting third information from a plurality of non-access point stations (non-AP STAs) with regard to an uplink (UL) multi-user (MU) TXOP; and
said second receiver sending said third information to said first transceiver; and
based on said third information, said first transceiver scheduling said UL MU TXOP based on said third information and signaling said plurality of non-AP STAs to transmit data to said first transceiver in said UL MU TXOP.

25. The method of claim 17, further comprising a cooperative management unit performing data fragmentation or data aggregation for said first transceiver and said second transceiver simultaneously transmitting an A-MPDU in said first TXOP.

26. The method of claim 17, further comprising:
said second transceiver performing the CCA while said first transceiver is transmitting said payload to said first wireless communication device.

27. The wireless communication device of claim 1, wherein said second wireless channel is a Bluetooth channel.

28. The wireless communication device of claim 1, wherein said second wireless channel is an RF channel.

* * * * *